United States Patent [19]

Knoerzer

[11] Patent Number: 4,692,648
[45] Date of Patent: Sep. 8, 1987

[54] ROTATING COLLECTOR ASSEMBLY FOR ELECTRICAL MACHINES

[76] Inventor: Karl-Heinz Knoerzer, Im Kleegärtle 7a, 7818 Vogtsburg/Achkarren, Fed. Rep. of Germany

[21] Appl. No.: 863,734

[22] Filed: May 7, 1986

[51] Int. Cl.$^4$ .................. H02K 13/00; H01R 39/16
[52] U.S. Cl. .................................. 310/233; 310/236
[58] Field of Search ............ 310/231, 233, 235, 236, 310/216, 42, 217, 218, 219

[56] References Cited

U.S. PATENT DOCUMENTS 4,647,807  3/1987  Knoerzer .......................... 310/233

FOREIGN PATENT DOCUMENTS 166162  12/1949  Austria ............................. 310/236
1034262  7/1958  Fed. Rep. of Germany ...... 310/236

Primary Examiner—Patrick R. Salce
Assistant Examiner—D. L. Rebsch
Attorney, Agent, or Firm—Staas & Halsey

[57] ABSTRACT

A rotating collector for electrical machines including a carrier bushing onto which a rim of collector segments is attached. The carrier bushing has first, swallowtail-type attachment devices in the form of circumferential crosspieces having slits formed therein and ring grooves, into which second swallowtail-type attachment devices formed on each collector segment are inserted at an angle to the carrier bushing axis. Each inserted collector segment is then oriented in the axial direction to create an intermeshing arrangement to complete the rim.

5 Claims, 3 Drawing Figures

ROTATING COLLECTOR ASSEMBLY FOR ELECTRICAL MACHINES

BACKGROUND OF THE INVENTION

The invention concerns a collector for electrical machines.

A known collector of this type has a carrier bushing, on whose outer mantle swallowtail-type attachment devices which extend in the circumferential direction are provided. On this carrier bushing, collector segments are attached by means of complementary, swallowtail-type attachment devices. The collector segments each extend in an axial direction, and they form a rim of segments around the carrier bushing, with adjacent collector segments being electrically insulated from one another. The swallowtail-type attachment devices are designed in such a way that an intermediate space remains between the carrier bushing and the collector segments. This intermediate space is filled with a casting material, for example a fiber-reinforced epoxy resin. The casting material connects the collector segments with the carrier bushing, and, when hardened, forms an insulating layer between the carrier bushing and the collector segments.

In the known collector, the swallowtail-type attachment devices on the carrier bushing and the collector segments are selected in such a way that axially oriented collector segments can be attached to the carrier bushing radially from the outside. This is done by having swallowtails on the collector segments fit through the neck-type constrictions of swallowtail openings in the carrier bushing, and in the same manner, having swallowtails on the carrier bushing fit through the neck-type constrictions of swallowtail openings in the collector segments. When the rim of segments is installed, swallowtails do fit into swallowtail openings but the swallowtail structure does not mesh. A rigid connection between the carrier bushing and the rim of segments is not formed until the gap remaining between the two is filled with the casting material.

With this type of construction, it is true that axially oriented collector segments can be radially attached to the carrier bushing, but the casting material located between the segments and the carrier bushing is also under tensile stress during operation. For reasons of stability, the circumferential velocity of the known collector is therefore restricted to approximately 40 meters per second.

Modern drive technology, however, demands more revolutions per minute for many electrical machines, and also the possibility of operation at higher temperatures, in order to achieve greater output while maintaining the structural size, and to be able to eliminate intermediate gears in many cases. This requirement cannot be met with the known collector.

According to the not published German patent application No. P 34 43 107.1 of the applicant, the state of the art includes a collector of the stated type in which the attachment devices on the carrier bushing and the collector segments are resting in an intermeshing swallowtail arrangement when the collector segments are oriented axially, in which the neck of a swallowtail opening is so narrow that the head of the swallowtail which is fitted into it does not fit through. In order to achieve this intermeshing arrangement, the swallowtail crosspieces of the carrier bushing are interrupted by means of a radial slit. The collector segments are inserted into the slit and are pulled onto the carrier bushing in circumferential direction. After attaching all collector segments except one in this way, the slit is closed by means of a wedge which carries the last collector segment. The wedge is a profile part sitting in a profile groove of the carrier bushing, to take up the attacking centrifugal forces.

Although this collector construction is quite advantageous, it would require considerable manufacturing and installation expenditures. Furthermore and for reasons of stability, it is of disadvantage, on principle, that the swallowtail crosspieces of the carrier bushing are interrupted by a continuous radial slit.

SUMMARY OF THE INVENTION

It is the primary object of the invention, as an improvement to the last mentioned construction, to create a collector which is simple in its design, which can be produced economically, and which makes it possible, under high thermal load, to achieve increased circumferential velocities, not least because of its good air cooling.

This object is achieved with a collector of the stated type, wherein at least one point of its circumference, the carrier bushing has slits in the swallowtail-shaped crosspieces of the carrier bushing, enabling the insertion of the collector segments which are oriented at an angle to the axial direction, so that the intermeshing swallowtail arrangement can be achieved when the collector segments are reoriented the axial direction.

The invention avoids continuous axial slits in the swallowtail-shaped crosspieces of the carrier bushing, thus eliminating possible weak points of the collector arrangement. Furthermore, the wedges required in the state of the art for closing these slits become superfluous. Nonetheless, after installation of the collector, the desired intermeshing of the swallowtail-type attachment devices on the carrier bushing and the collector segments is achieved, and the casting material located between the adjacent surfaces is therefore subject only to pressure stress. By this means, circumferential velocities of the collector of up to 70 m/s can be achieved, with a minimum excentricity of the collector surface. Also, any convex tension which was built up in the interlocking segments before the casting material was introduced can be fully maintained. Another advantage of the construction according to the invention is the slight amount of radial space needed to anchor the segments, independent of the total length of the collector. This makes it possible to provide large ventilation openings in the carrier bushing, and thanks to the improved cooling possibilities, the thermal load capacity of the collector is improved. At the same time, the weight of the collector can be significantly reduced.

An important area of application for the collector according to the invention are drive motors for means of transportation which run on rails, which is designated as traction machines. For these machines, screw collectors were almost exclusively used until now, but they have known disadvantages, such as, e.g. great weight, high manufacturing costs, a low ventilation capacity, etc. Here, the invention yields significant improvements.

According to the invention, the carrier bushing has slits in the area of the swallowtail-shaped crosspieces, which make it possible to insert the collector segments at an angle. The slits of adjacent crosspieces are situated offset in circumferential direction, so that the resulting weakening of the carrier bushing is distributed over a larger peripheral surface. In a preferred embodiment of the invention, the slits of adjacent crosspieces are offset in the circumferential direction by at least the width of one collector segment. In this way, it is achieved that after an axial reorientation of the collector segments, each collector segment in the installation area will meet only one slit. So that, of all the crosspieces holding the collector segments, at the most, one of them will have a slit, while all other crosspieces are without slits and the structural weakening will be accordingly low.

For reasons of stability, the slits should be as small as possible. In particular, they can have a width exceeding that of a collector segment by only a small installation play. The slits are then oriented along a straight line, along which the collector segments are inserted into the carrier bushing at an angle to the axial direction.

All the slits can be located on the same side of the crosspieces and intersect their swallowtail heads, hitting the swallowtail ring groove situated radially therefrom on the inside. At least one outer crosspiece, or even several crosspieces of the carrier bushing can remain without a slit. This helps to reduce the weakening due to the slits to a minimum and facilitates the insertion of the collector segments in a swivelling motion, the plane of which is not an axial plane.

The carrier bushing can be provided with slits by a cutting operation. Of particular consideration are milled slits.

The invention is explained in greater detail below, using the preferred embodiment shown in the diagrams.

DETAILED DESCRIPTION OF THE PREFERRED EMBODIMENTS

Figure 1:
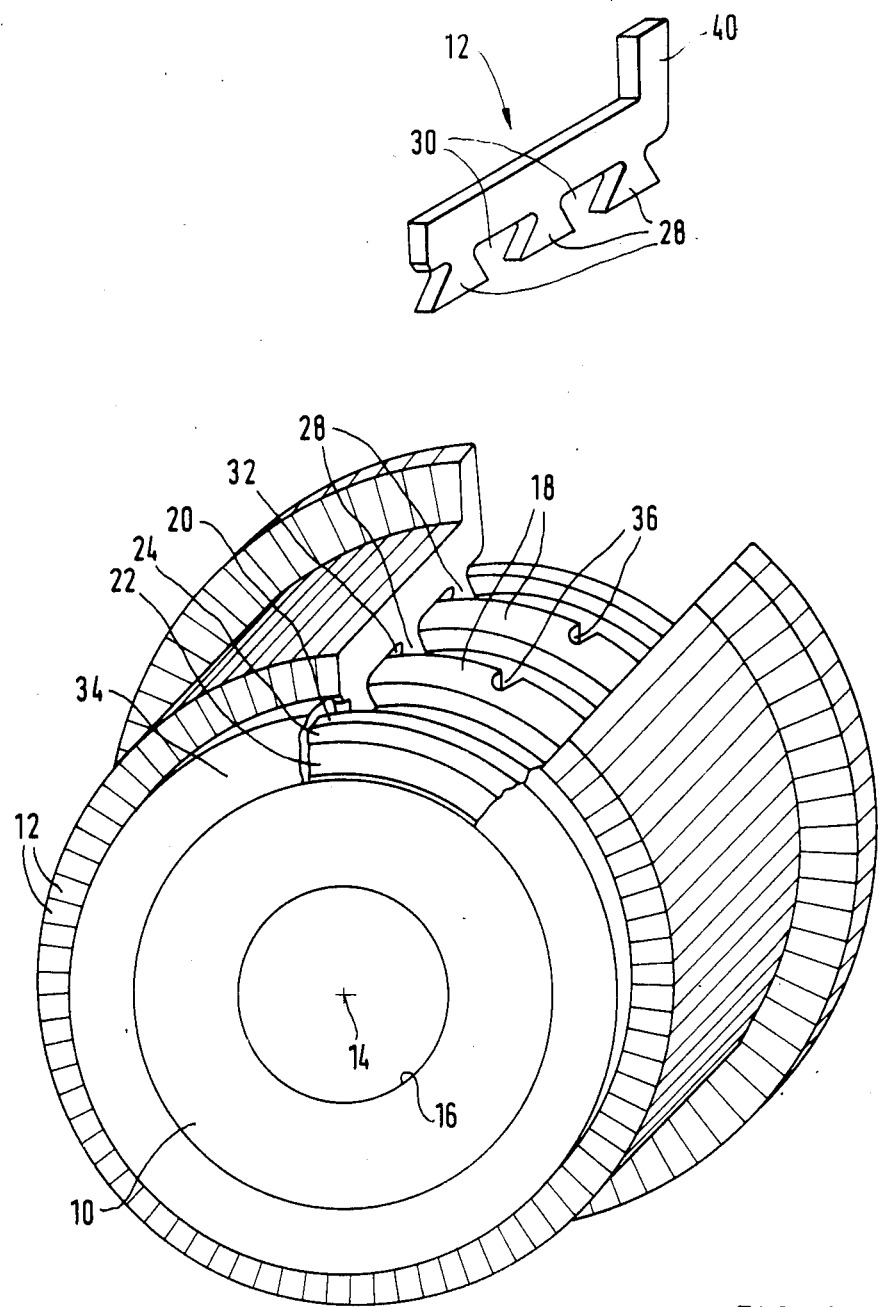
FIG. 1 shows a perspective view of a collector with the casting material partially broken away, collector segments removed in the area of installation and one individual collector segment above the installation area.

With reference to FIG. 1, the collector shown consists a carrier bushing 0 and a rim of collector segments 12 pulled onto the carrier bushing 10 in the circumferential direction. This rim is partially broken up, so that an installation area of the carrier bushing 10 becomes visible. The carrier bushing 10 has the basic shape of a circular cylinder. Its center axis 14 represents the rotational axis of the collector. In the vicinity of this rotational axis 14, the carrier bushing 10 is formed as a collector hub, which is indicated by a central, axial cylinder bore 16 in the embodiment shown. The collector hub can have any other desired shape, however, and can be formed, e.g., as a guide bushing mounted in a cross, a cloverleaf opening, etc. (not shown). The collector rests with its hub on the shaft of an electrical machine, such as e.g. an electromotor, a generator or a transformer.

On the outer mantle of the carrier bushing 10 there are attachment devices for the collector segments 12 in the form of crosspieces 18, 20, which extend in the circumferential direction. According to FIG. 1, four parallel crosspieces 18, 20 are provided at axial intervals.

The two center crosspieces 18 have a swallowtail shape in their cross section, and widen radially in an outward direction. The outer crosspieces 20, in contrast, have the cross-sectional shape of a swallowtail cut in half in a median plane, and they are additionally cut at a slant in the area of their heads, so that the axial front surfaces 22 of the carrier bushing 10 have a circumferential bevel 24 radially on the outside.

Between crosspieces 18, 20 on the outer mantle of the carrier bushing 10, there are ring grooves 26 (FIG. 2) circulating in the circumferential direction. Their groove openings also have a swallowtail-shaped cross section, and they widen radially from the outside to the inside. The groove openings are wider and deeper than the swallowtail-shaped crosspieces 18.

The collector segments 12 are circular cylinder segments, with essentially the same axial length as the carrier bushing 10. They are preferably made of copper and are attached in a rim on the outer mantle of the carrier bushing 10, so that they are insulated from one another and from the carrier bushing 10. The collector segments 12 have swallowtail-type attachment devices on their radial inner edge for this purpose; these intermesh with the ones on the carrier bushing 10. In detail, three swallowtails 28 which project from the radial inner edge of the collector segment 12 can be seen; there are two swallowtail openings 30 between them. The latter are again larger than the swallowtails 28. In the installed state, the swallowtails 28 of the collector segments 12 come to rest in the ring grooves 26 of the carrier bushing 10, and the crosspieces 18, 20 of the carrier bushing 10 mesh into the swallowtail openings 30 of the collector segments 12.

The carrier bushing 10 and the collector segments 12 do not touch one another when this happens. Instead, a gap 32 remains between the swallowtail structures, and this is filled with a casting material 34.

According to the invention, with axially oriented collector segments 12 an interlocking swallowtail arrangement is provided, in which the neck of the swallowtail openings 26, 30 is so narrow in each case that the heads of the swallowtails 18, 28 which come to rest in them do not fit through the constriction. When axially oriented, the collector segments 12 can therefore not simply be attached radially onto the carrier bushing 10. Instead, they can only be introduced in an installation area of carrier bushing 10 shown in detail in FIGS. 1 through 3.

In this installation area, the center crosspieces 18 of carrier bushing 10 are provided with slits 36. The slits are all situated on the same halfside of the crosspieces 18. They intersect the swallowtail head and hit the cross-sectional swallowtail-shaped ring groove 26 situated radially on the inside. As can best be seen in FIG. 2, the slits 36 are oriented along a straight line 38 at an angle α to the center axis 14 of the collector. The slits 36 are wider by a small installation play than a collector segment 12. The slits 36 are machined with a milling cutter of corresponding diameter and their inner periphery is rounded. But this form is not imperative for the invention; instead the slits 36 can also have a rectangular shape.

To attach the collector segments 12, they are oriented in longitudinal direction and parallel to straight line 38. As can be seen in FIG. 3, first an outer swallowtail 28 of collector segment 12 is inserted into that outer ring groove 26 of carrier bushing 10 which is not widened by means of a slit 36. Then, the collector segment 12 is pulled down in a swivelling motion and, as a consequence, all its remaining swallowtails 28 are guided through the slits 36. The swivel plane crosses the straight line 38 and is perpendicular to the drawing plane of FIG. 2; i.e. it includes the stated angle α by means of an axial plane perpendicular to the drawing plane of FIG. 2. As soon as the collector segment 12 has been pulled down, it can be oriented in axial direction; in this way the required intermeshing swallowtail arrangement is achieved.

Figure 2:
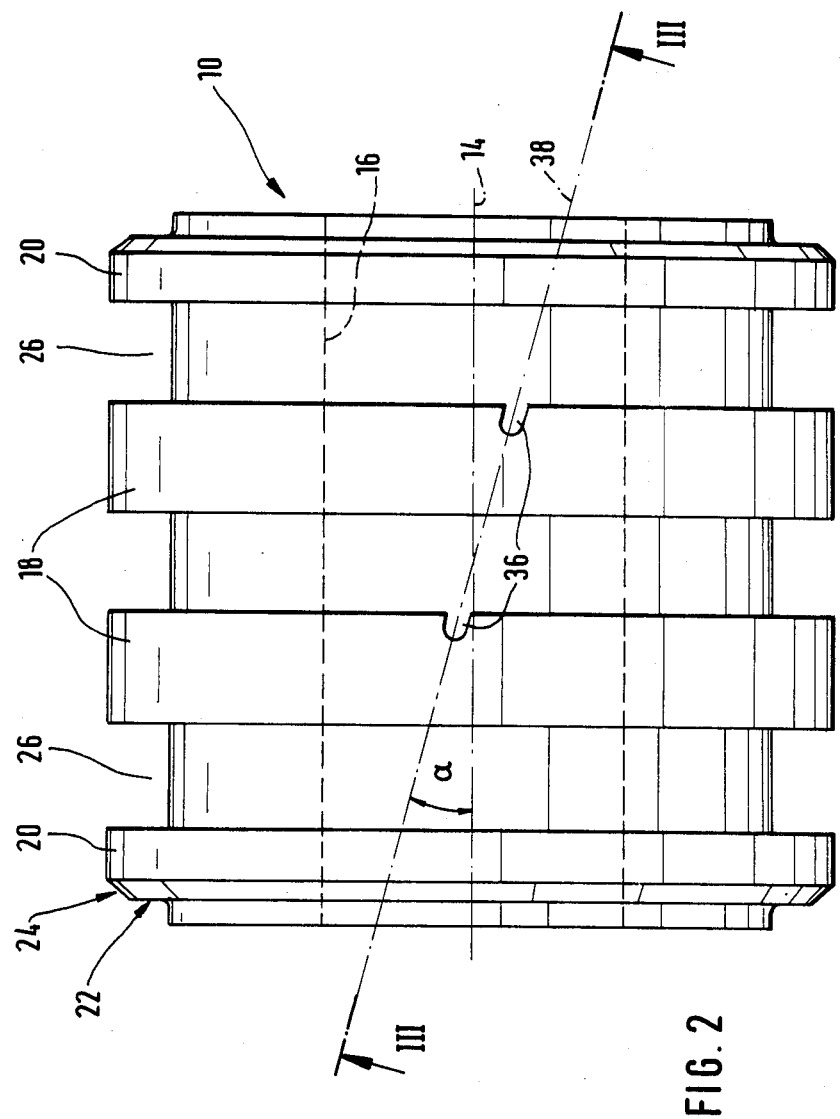
FIG. 2 shows a radial top view of the installation area of a carrier bushing of the collector.
Figure 3:
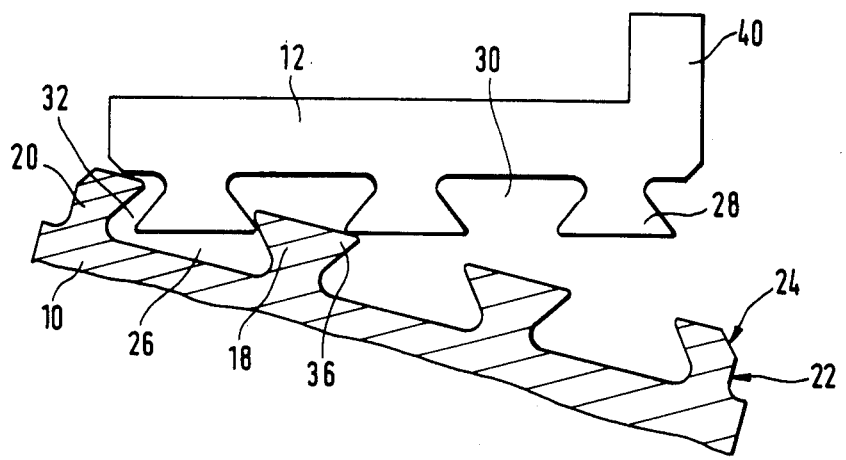
FIG. 3 shows a sectional view of the carrier bushing, following the line III—111 in FIG. 2, with a collector segment shown in the phase of insertion.

With reference to FIG. 2, the slits 36 of adjacent crosspieces 18 are offset to one another in the circumferential direction. This offset should at least correspond to the width of a collector segment. In this way, it is achieved that after orienting all collector segments 12 in axial direction, at the most one slit will come to be positioned above a collector segment 12. The resulting weakening of the structure will be small. During installation, the newly placed collector segments 12 are introduced and pulled onto the carrier bushing 10 in circumferential direction, maintaining the orientation of the collector segments 12 at an angle to the center line 14. In this way the segment rim is closed until a gap remains exactly at the slits 36 for the last collector segment. This last collector segment is attached; now the rim can be turned until all collector segments 12 have reached their final position in axial and in longitudinal direction. Then the casting material 34 is introduced in a molding process, and this closes the gap 32 between the carrier bushing 10 and the collector rim.

As can especially be seen in FIG. 3, the swallowtails 18, 20, 28 on the carrier bushing 10 and collector segments 12 are of equal size, and they are located at equal axial intervals. In the same way, the swallowtail openings 26, 30 of the carrier bushing 10 and collector segments 12 are also of equal size relative to one another, and located at equal axial intervals, and, as mentioned, they are larger than the swallowtails 18, 20, 28 which fit into them. The contours of the swallowtails and the swallowtail openings are the same, so that a gap 32, with a more or less constant width throughout, remains between the carrier bushing 10 and the collector segments 12. The casting material 34 filled into this gap therefore forms a layer with an approximately constant thickness throughout. In its hardened state, it holds the segment rim onto the carrier bushing 10 and simultaneously forms an electrical insulation between the carrier bushing 10 and the individual collector segments 12.

In operation, the layer of casting material 34, located between the flanks of the swallowtail structure is primarily under pressure stress, due to the centrifugal forces acting on the collector segments 12. The casting material 34 can absorb significant pressure forces, so that higher circumferential velocities at the collector mantle can be handled with the invention.

The described, in a meander structure intermeshing attachment devices of carrier bushing 10 and the collector rim do not necessarily have to have a swallowtail shape. Instead, other interlocking rigid attachment devices can be used, which have grooves with neck-type constrictions as well as complementary heads which fit into the grooves, where the heads do not fit through the neck-type constrictions.

It is also understood that the invention is not restricted to the number of swallowtail openings and swallowtails intermeshing with them as shown in the Figures. Rather, depending on the axial length of the collector, a number of swallowtails which is adapted to this length can be used. The form of attachment according to the invention is therefore suitable for all possible structural sizes.

The collector segments 12 shown in the Figures have a radially projecting connection lug 40 at their axial end. The presence of such a lug is not required for the invention, however. Adjacent collector segments 12 can be insulated from one another with mica, for example. As casting material 34, a fiber reinforced epoxy resin combination without asbestos fillers, which is resistant to creep current, is particularly suitable.

As can be seen in FIG. 1 in the front, the carrier bushing 10 projects beyond the collector segment rim in the axial direction. It is recommended that casting material 34 also be applied in the area of this projection, in order to create a flush front surface in this way. In the embodiment shown, the entire half-swallowtail 20 is imbedded in casting material 34.

The slight thickness should be noted of the casting material layer 34, which is sufficient to create a perfect connection between the carrier bushing 10 and the collector segments 12. The thin plastic layer makes good heat exchange possible, and prevents undesirable thermal stress. The close intermeshing of the collector segments 12 with the carrier bushing 10, with an exactly defined distance, forms a mechanical connection of great strength. A further advantage of this type of construction is the slight amount of radial space required to anchor the collector segments 12, independent of the total axial length. This makes it possible to provide large ventilation openings in the carrier bushing 10, i.e. the collector hub, with extensive freedom as far as the shape is concerned. This results in better cooling, i.e. greater output, particularly for applications in motors cooled by flow-through ventilation. The uniform distribution of the centrifugal forces over the entire collector length makes a low segment height possible, even at extreme circumferential velocities. The collector according to the invention is characterized by very good dielectrical properties. It has a great insulation resistance, independent of the temperature, and can be produced particularly in insulation classes F and H. For the total size, a diameter range of 70 to 500 mm and a total axial length of 15 to 450 mm are being considered, but the manufacture of larger or smaller collectors is certainly possible. Over all, a molding material collector for increased circumferential velocities and a greater thermal load capacity, with good air cooling possibilities and economic production at the same time, is achieved in this way.

I claim:

1. A collector for electrical machines, comprising:
    (a) a carrier bushing having an outer mantle on which are provided, extending in the circumferential direction,
        (i) first, swallowtail-type attachment devices in the form of crosspieces with first and second sides, wherein each of at least two of the crosspieces has formed therein a slit of a particular width, and
        (ii) ring grooves formed adjacent the crosspieces;
    (b) a plurality of collector segments, each of which has a particular width and which can be attached to the carrier bushing by means of second, complementary, swallowtail-type attachment devices formed thereon in an intermeshing swallowtail arrangement, when the collector segments (12) are oriented axially, in which a neck of a swallowtail-type opening is so narrow that a corresponding swallowtail-type head which is fitted into each neck does not fit through the neck; and (c) an intermediate space remaining between the carrier bushing and the collector segments, which can be filled with a casting material, wherein the slits formed in the crosspieces enable the insertion of the second swallowtail type attachment devices of each collector segment, when the collector segment is oriented at an angle to the axial direction, so that the intermeshing swallowtail arrangement can be achieved when each collector segment is oriented in the axial direction.

2. A collector according to claim 1, wherein the slits are offset in the circumferential direction by at least the particular width of one collector segment.

3. A collector according to claim 1, wherein the particular width of each slit slightly exceeds the particular width of each collector segment and the slits are oriented along a straight line.

4. A collector according to claim 1, wherein each slit is provided on the first side of each crosspiece and intersects the swallowtail head of the corresponding crosspiece and the ring groove adjacent thereto.

5. A collector according to claim 1, wherein at least one of the outer crosspieces has no slit.

* * * * *